United States Patent
Hsu et al.

(10) Patent No.: US 12,315,828 B2
(45) Date of Patent: May 27, 2025

(54) PACKAGE SUBSTRATE, ELECTRONIC DEVICE PACKAGE AND METHOD FOR MANUFACTURING THE SAME

(71) Applicant: Advanced Semiconductor Engineering, Inc., Kaohsiung (TW)

(72) Inventors: Wu Chou Hsu, Kaohsiung (TW); Chih-Cheng Lee, Kaohsiung (TW); Min-Yao Chen, Kaohsiung (TW); Hsing Kuo Tien, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 708 days.

(21) Appl. No.: 17/589,720

(22) Filed: Jan. 31, 2022

(65) Prior Publication Data

US 2022/0157745 A1    May 19, 2022

Related U.S. Application Data

(63) Continuation of application No. 16/899,507, filed on Jun. 11, 2020, now Pat. No. 11,239,184.

(51) Int. Cl.
*H01L 23/64* (2006.01)
*H01L 21/48* (2006.01)
(Continued)

(52) U.S. Cl.
CPC ........ *H01L 23/645* (2013.01); *H01L 21/4853* (2013.01); *H01L 21/4857* (2013.01);
(Continued)

(58) Field of Classification Search
CPC ............... H01L 23/5383; H01L 23/645; H01L 21/4853; H01L 23/5386; H01L 23/5389;
(Continued)

(56) References Cited

U.S. PATENT DOCUMENTS 7,687,283 B2   3/2010   Terui
10,145,906 B2  12/2018  O'Donnell et al.
(Continued)

OTHER PUBLICATIONS

Notice of Allowance for U.S. Appl. No. 16/899,507, issued Sep. 23, 2021, 9 pages.

*Primary Examiner* — Wasiul Haider
(74) *Attorney, Agent, or Firm* — FOLEY & LARDNER LLP

(57) ABSTRACT

The present disclosure provides a package substrate and method of manufacturing the same. The package substrate includes a substrate, an electronic component and a conductive trace. The electronic component is disposed in the substrate, and the electronic component includes a magnetic layer and a conductive wire. The conductive wire includes a first section embedded in the magnetic layer, and a second section connected to the first section and thinner than the first section. A first upper surface of the first section is covered by the magnetic layer, a second upper surface of the second section is lower than the first upper surface, and the magnetic layer includes a first recess disposed in the upper surface and exposing the second upper surface of the second section. The first conductive trace is in the first recess and electrically connected to the second upper surface of the second section of the conductive wire.

18 Claims, 22 Drawing Sheets

(51) Int. Cl.
  *H01L 21/56* (2006.01)
  *H01L 23/00* (2006.01)
  *H01L 23/31* (2006.01)
  *H01L 23/538* (2006.01)

(52) U.S. Cl.
  CPC ........ *H01L 21/565* (2013.01); *H01L 23/3128* (2013.01); *H01L 23/5383* (2013.01); *H01L 23/5386* (2013.01); *H01L 23/5389* (2013.01); *H01L 24/16* (2013.01); H01L 2224/16227 (2013.01); H01L 2924/19042 (2013.01); *H01L 2924/19103* (2013.01)

(58) Field of Classification Search
  CPC ........... H01L 24/16; H01L 2224/16227; H01L 2924/19103; H01L 2924/19042; H01L 21/4857; H01L 23/3128; H01L 2224/32225; H01L 23/3121; H01L 23/49838; H01F 27/2823; H01F 2017/0066; H01F 17/0013; H01F 27/24
  See application file for complete search history.

(56) References Cited

U.S. PATENT DOCUMENTS 11,239,184 B2 * 2/2022 Hsu .................... H01L 23/3128
2021/0104475 A1 * 4/2021 Radhakrishnan ....... H01L 24/16

\* cited by examiner

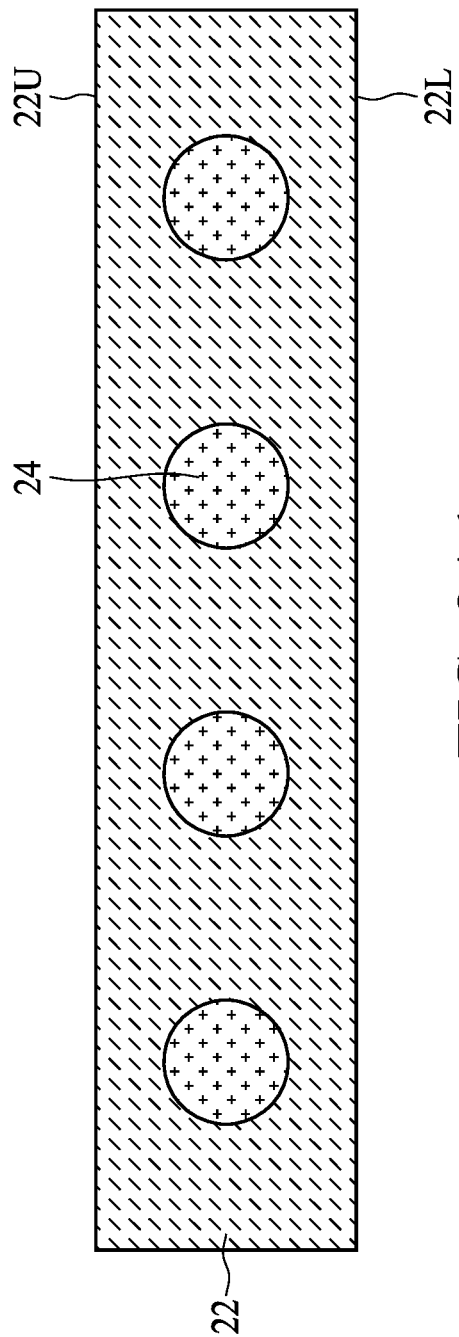
FIG. 2A1

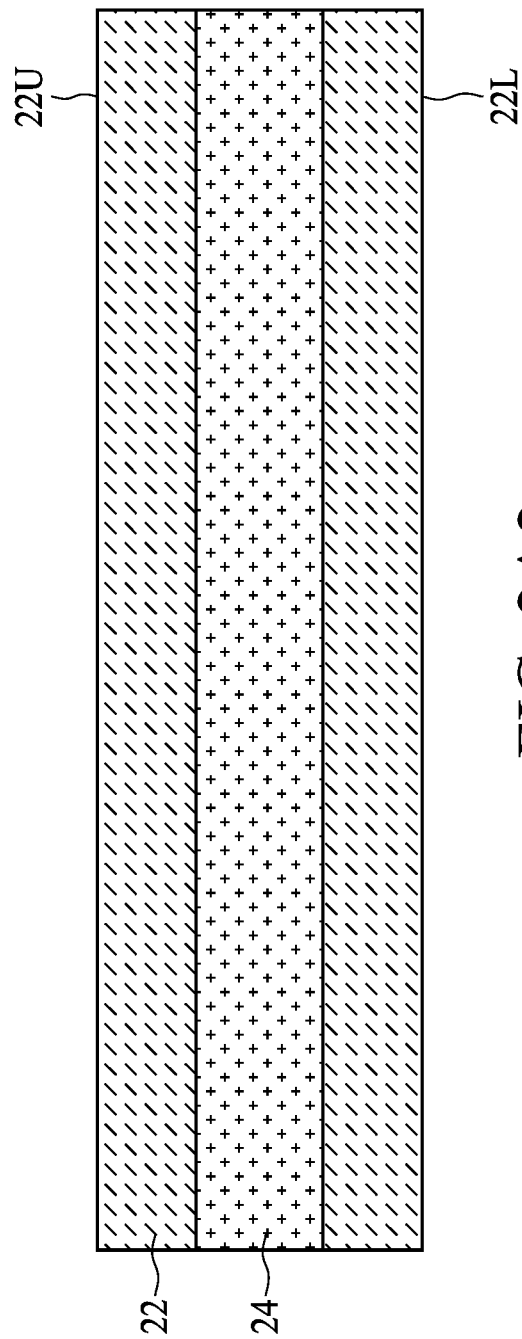
FIG. 2A2

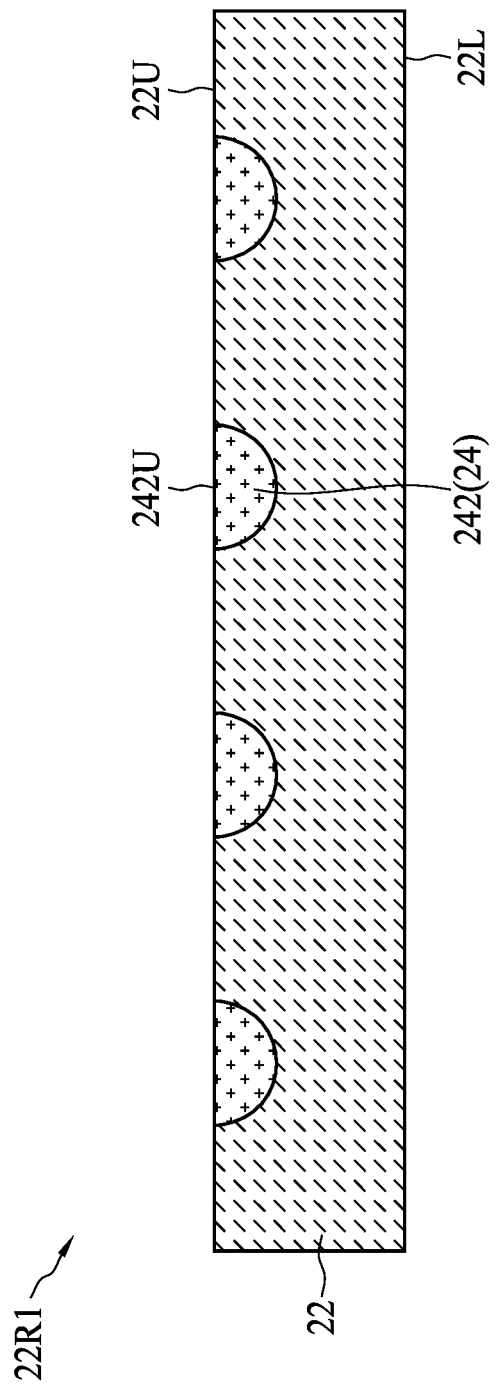
FIG. 2B1

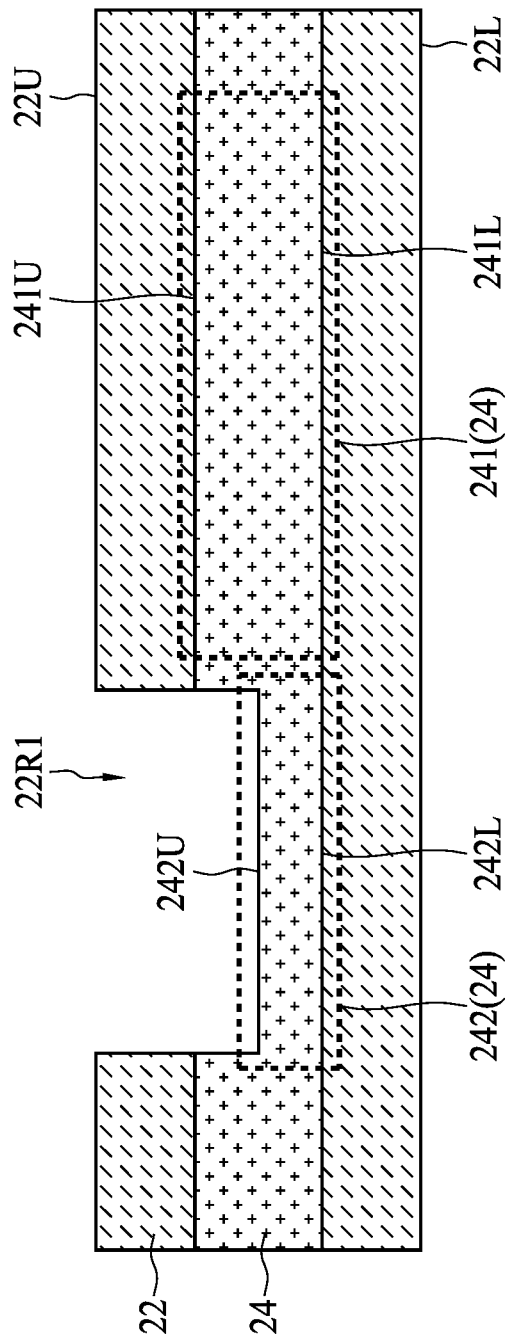
FIG. 2B2

PACKAGE SUBSTRATE, ELECTRONIC DEVICE PACKAGE AND METHOD FOR MANUFACTURING THE SAME

CROSS-REFERENCE TO RELATED APPLICATION

This application is a continuation of U.S. patent application Ser. No. 16/899,507 filed Jun. 11, 2020, the contents of which is incorporated herein by reference in its entirety.

BACKGROUND

1. Technical Field

The present disclosure relates to a package substrate and manufacturing method thereof, and more particularly, to a package substrate with embedded electronic component and manufacturing method thereof.

2. Description of the Related Art

As multiple functions and high performance have become typical requirements of consumer electronic and communication products such as smart phones, electronic device packages are expected to possess superior electrical properties, low power consumption and a large number of I/O ports. In order to achieve multiple function and high performance, the electronic device packages are equipped with more active components and passive components. The active components and passive components, however, increase the overall thickness of the electronic device package. It is therefore desirable to develop a package substrate with thin thickness, multiple functions, high performance and low power consumption to meet the compactness requirement of consumer electronic and communication products.

SUMMARY

One aspect of the present disclosure relates to a package substrate. In some embodiments, a package substrate includes a substrate, an electronic component and a first conductive trace. The substrate includes a first surface and a second surface opposite to the first surface. The electronic component is disposed in the substrate, and the electronic component includes a magnetic layer and a conductive wire. The magnetic layer includes an upper surface adjacent to the first surface and a lower surface adjacent to the second surface. The conductive wire includes a first section embedded in the magnetic layer, and a second section connected to the first section and thinner than the first section. A first upper surface of the first section is covered by the magnetic layer, a second upper surface of the second section is lower than the first upper surface, and the magnetic layer includes a first recess disposed in the upper surface and exposing the second upper surface of the second section. The first conductive trace is in the first recess and electrically connected to the second upper surface of the second section of the conductive wire.

Another aspect of the present disclosure relates to a method of manufacturing a package substrate. In some embodiments, the method includes the following operations. An electronic component is provided. The electronic component includes a magnetic layer and a conductive wire at least partially covered by the magnetic layer. The magnetic layer and the conductive wire are recessed to form a recess partially exposing a portion of the conductive wire. The electronic component is disposed in a cavity of a substrate. A dielectric layer is formed in the cavity and in the recess. A perforation is formed in the dielectric layer in the recess to expose the portion of the conductive wire. A first conductive trace is formed on the portion of the conductive wire exposed through the perforation of the dielectric layer.

Another aspect of the present disclosure relates to a method of manufacturing a semiconductor device package. In some embodiments, the method includes the following operations. The aforementioned package substrate is provided. A first redistribution layer (RDL) is formed on the first surface of the substrate. A first semiconductor die is disposed on the first RDL. The first semiconductor die is encapsulated. A plurality of electrical connectors are formed on the second surface.

BRIEF DESCRIPTION OF THE DRAWINGS

Aspects of some embodiments of the present disclosure are readily understood from the following detailed description when read with the accompanying figures. Various structures may not be drawn to scale, and the dimensions of the various structures may be arbitrarily increased or reduced for clarity of discussion.

FIG. 2A, FIG. 2A1, FIG. 2A2, FIG. 2B, FIG. 2B1, FIG. 2B2, FIG. 2C, FIG. 2D and FIG. 2E illustrate operations of manufacturing a package substrate in accordance with some embodiments of the present disclosure.

DETAILED DESCRIPTION

Figure 1:
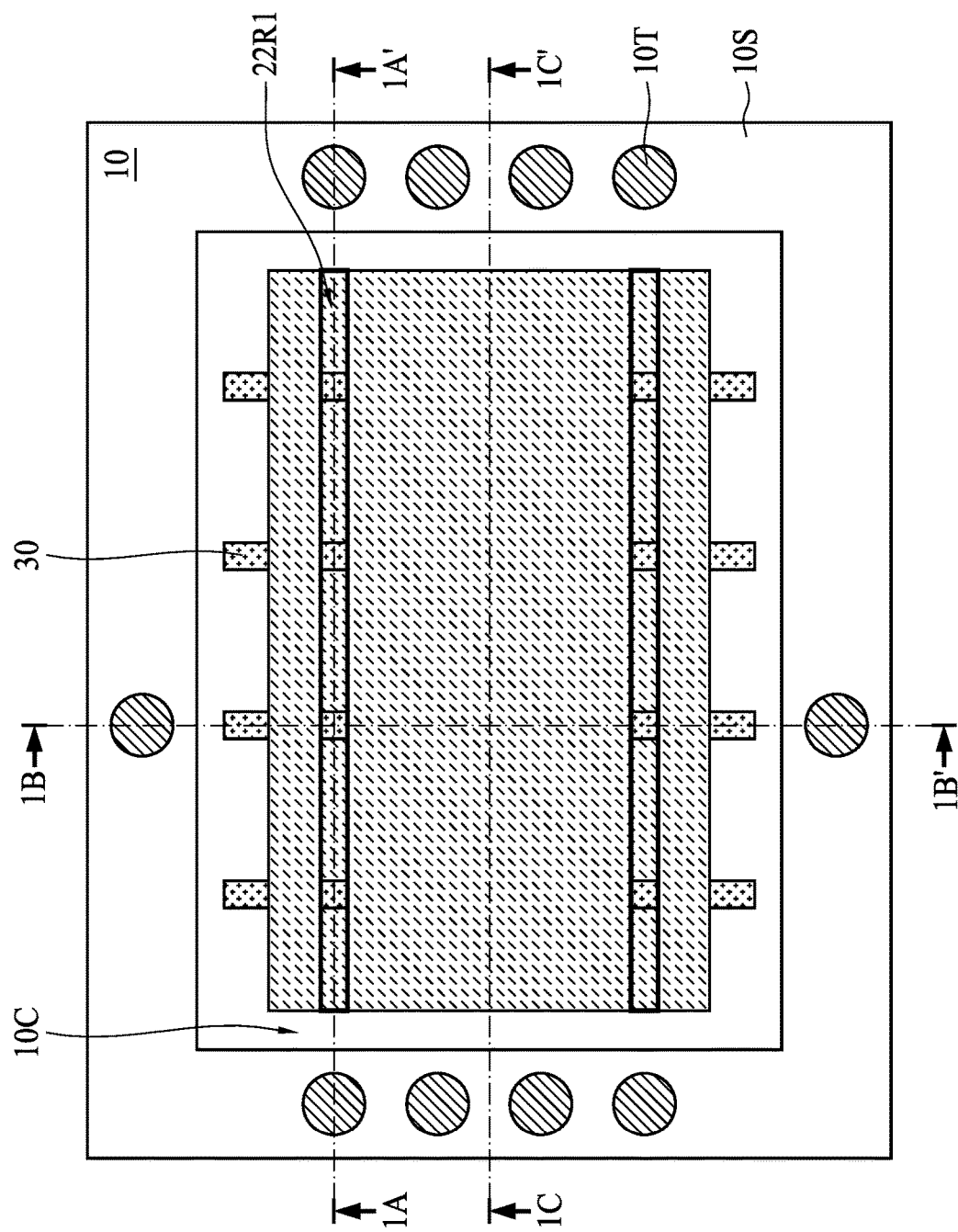
FIG. 1 is a schematic top view of a package substrate in accordance with some embodiments of the present disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "above," "over," "on," "upper," "lower," "left," "right," "vertical," "horizontal," "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Figure 1A:
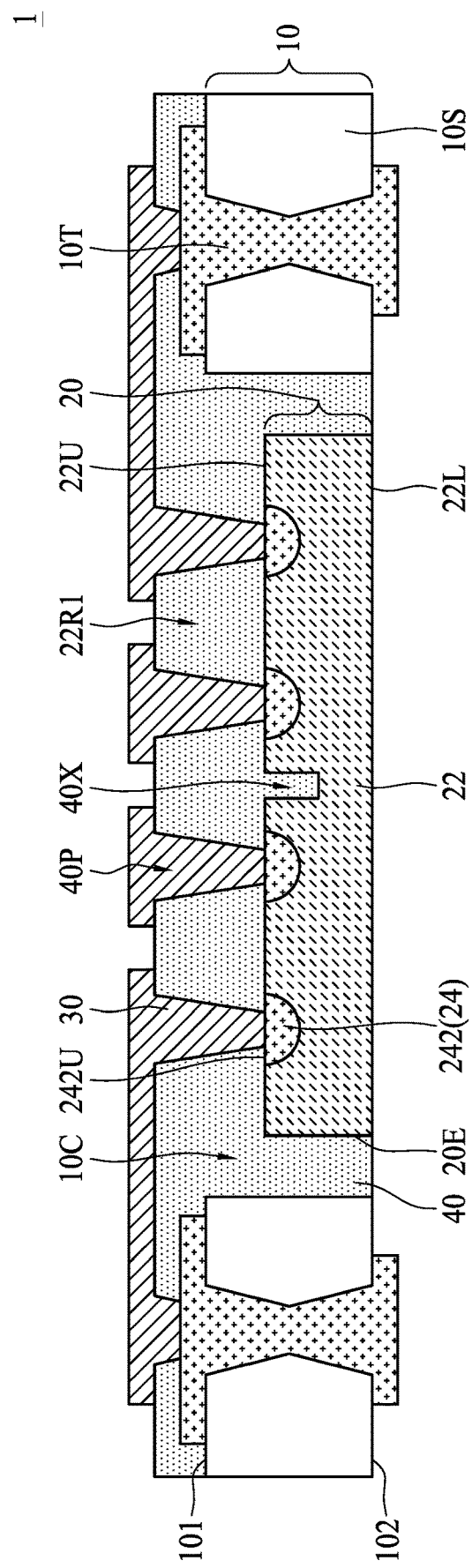
FIG. 1A is a cross-sectional view of the package substrate along a line 1A-1A' of FIG. 1.
Figure 1B:
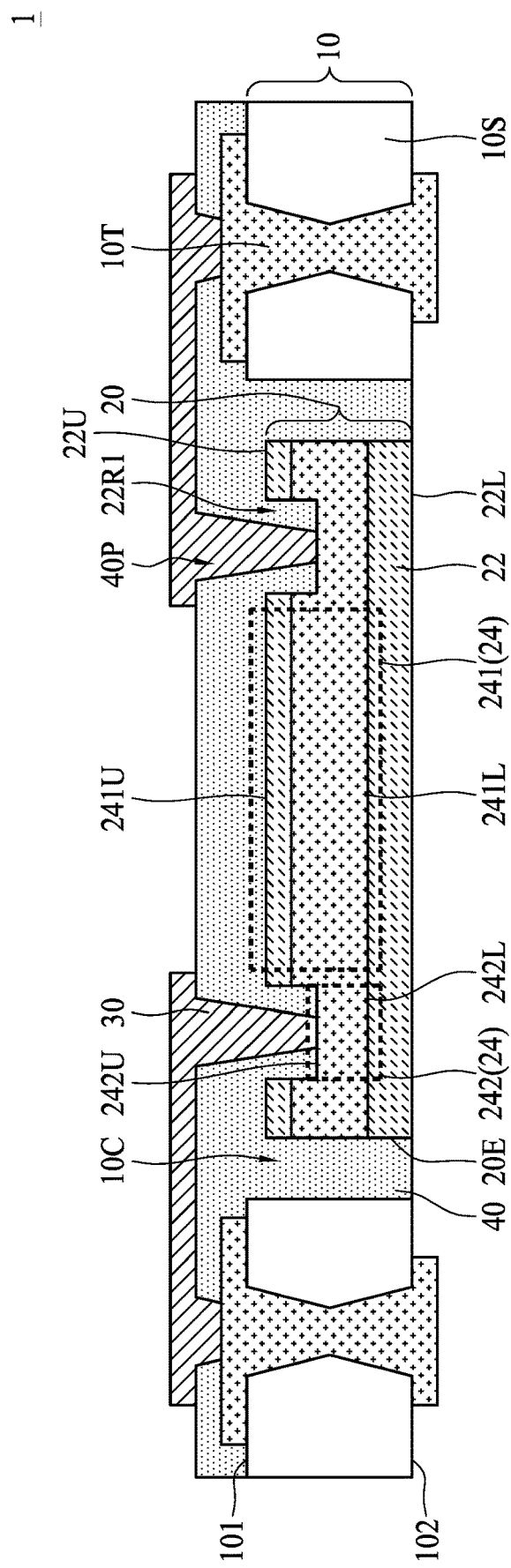
FIG. 1B is a cross-sectional view of the package substrate along a line 1B-1B' of FIG. 1.
Figure 1C:
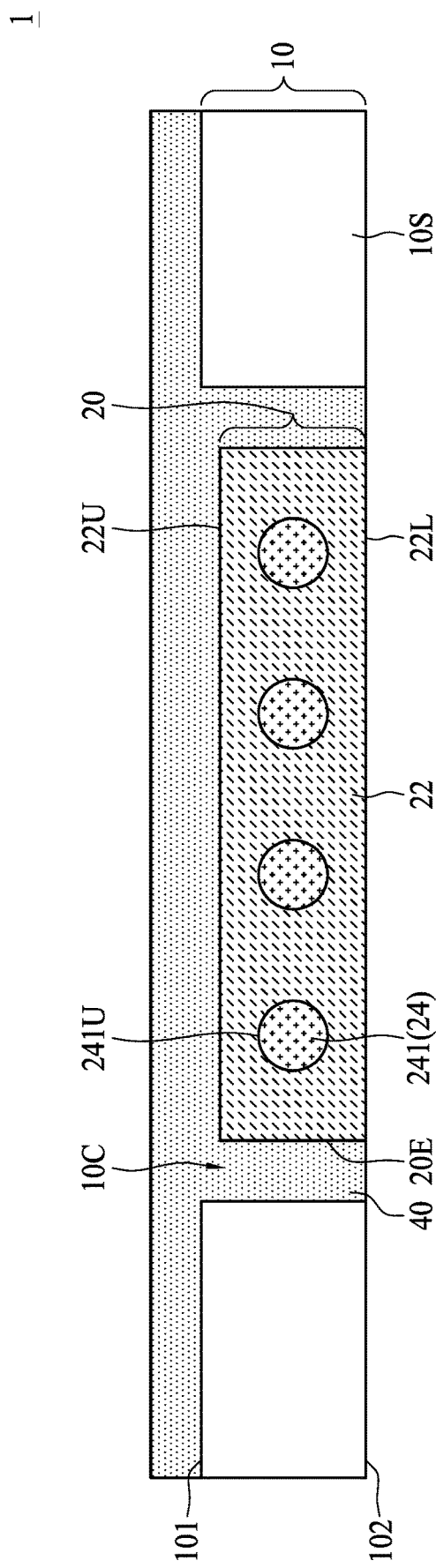
FIG. 1C is a cross-sectional view of the package substrate along a line 1C-1C' of FIG. 1.

FIG. 1 is a schematic top view of a package substrate 1 in accordance with some embodiments of the present disclosure, FIG. 1A is a cross-sectional view of the package substrate 1 along a line 1A-1A' of FIG. 1, FIG. 1B is a cross-sectional view of the package substrate 1 along a line 1B-1B' of FIG. 1, and FIG. 1C is a cross-sectional view of the package substrate 1 along a line 1C-1C' of FIG. 1. To highlight features of the package substrate 1, some components such as dielectric layer and conductive trace are not drawn in FIG. 1. As shown in FIG. 1, FIG. 1A, FIG. 1B and FIG. 1C, the package substrate 1 includes a substrate 10, an electronic component 20 and a conductive trace (e.g., a first conductive trace) 30. The substrate 10 includes a first surface 101 and a second surface 102 opposite to the first surface 101. The substrate 10 may include a package substrate with circuitry therein. For example, the substrate 10 may include a core substrate, a core-less substrate or other types of substrates. The substrate 10 may include a supporting portion 10S defining one or more cavities 10C for accommodating the electronic component 20. In some embodiments, the cavity 10C may, but is not limited to, penetrate through the substrate 10. In some embodiments, the material of the supporting portion 10S is relatively firm. By way of example, the material of the supporting portion 10S may include polypropylene (PP) or other suitable dielectric or insulative materials. The substrate 10 may include a plurality of conductive structures 10T such as conductive vias extending from the first surface 101 to the second surface 102 of the substrate 10 to electrically connect electronic components and/or semiconductor die disposed on the first surface 101 and the second surface 102. For example, the conductive structures 10T may include copper or other suitable conductive material. In some embodiments, the cross-sectional shape of the conductive structure 10T may include, but is not limited to, an X shape or an hourglass shape. In some other embodiments, the cross-sectional shape of the conductive structure 10T may include rectangular shape, trapezoid shape or other suitable shapes.

The electronic component 20 is disposed in the substrate 10. In some embodiments, the electronic component 20 is disposed in the cavity 10C of the substrate 10. The thickness of the electronic component 20 may be less than or equal to that of the substrate 10 such that the installation of the electronic component 20 may not increase the overall thickness of the package substrate 1. The electronic component 20 includes a magnetic layer 22 and one or more conductive wires 24. By way of examples, the electronic component 20 may include a passive component such as an inductor. The magnetic layer 22 includes an upper surface 22U adjacent to the first surface 101, and a lower surface 22L adjacent to the second surface 102. The magnetic layer 22 may include ferrite or other suitable magnetic materials. By way of example, the material of the magnetic layer 22 may include a compound of iron oxide and other components including one of magnesium (Mg), aluminum (Al), barium (Ba), manganese (Mn), copper (Cu), nickel (Ni), cobalt (Co) or the like. In some embodiments, the magnetic layer 22 is an opaque magnetic material, which is non-transparent to light. The conductive wire 24 may include metal wire such as copper wire. In some embodiments, two ends of the conductive wire 24 may, but are not limited to, slightly protrude out the magnetic layer 22. In some other embodiments, two ends of the conductive wire 24 may be substantially coplanar with the magnetic layer 22 or covered by the magnetic layer 22.

The conductive wire 24 may include a first section 241 embedded in the magnetic layer 22, and a second section 242 connected to the first section 241 and thinner than the first section 241. The first upper surface 241U of the first section 241 is covered by the magnetic layer 22. The second upper surface 242U of the second section 242 is lower than the first upper surface 241U. In some embodiments, the first section 241 includes a substantially circular cross-sectional shape, and the second section 242 includes a non-circular cross-sectional shape. By way of examples, the first upper surface 241U of the first section 241 includes a convex surface, and the second upper surface 242U of the second section 242 includes a substantially flat surface. The magnetic layer 22 includes a recess (e.g., a first recess) 22R1 disposed in the upper surface 221 and exposing the second upper surface 242U of the second section 242, such that the second upper surface 242U of the second section 242 can be viewable prior to formation of the conductive trace 30. The conductive trace 30 is disposed in the recess 22R1 and electrically connected to the second upper surface 242U of the second section 242 of the conductive wire 24. The non-circular cross-sectional shape of the second section 242 can enhance the adhesion between the conductive wire 24 and the conductive trace 30. In some embodiments, the conductive wire 24 may be configured as the coil of the inductor. In some embodiments, the electronic component 20 may include a plurality of conductive wires 24, and the electronic component 20 may include a plurality of inductors embedded in the magnetic layer 22. In some embodiments, the recess 22R1 includes a slot continuously transversing the plurality of conductive wires 24, and exposing the second upper surfaces 242U of the second sections 242 of the plurality of conductive wires 24 as shown in FIG. 1A.

The package substrate 1 may further include a dielectric layer 40 disposed between the magnetic layer 22 and the conductive trace 30. The dielectric layer 40 may include a transparent dielectric material or a semi-transparent dielectric material, which is transparent or semi-transparent to light. By way of examples, the dielectric layer 40 may include a thermoplastic material such as Acrylonitrile Butadiene Styrene (ABS). The dielectric layer 40 can be further disposed in the cavity 10C, and disposed between edges 20E of the electronic component 20 and the supporting portion 10S of the substrate 10. In some embodiments, the dielectric layer 40 is configured to fix the electronic component 20 in the cavity 10C. In some embodiments, the dielectric layer 40 may at least partially cover the upper surface 22U of the magnetic layer 22, and the dielectric layer 40 may expose the lower surface 22L of the magnetic layer 22. In some embodiments, the lower surface 22L may be higher than, substantially coplanar with or lower than the second surface 102 of the substrate 10. The dielectric layer 40 may be partially disposed in the recess 22R1, and include a perforation 40P in the recess 22R1 exposing the second upper surface 242U of the second section 242 of the conductive wire 24. The conductive trace 30 may be disposed on the dielectric layer 40 and filled in the perforation 40P and the recess 22R1 to electrically connect the second section 242 of the conductive wire 24. The conductive trace 30 may further extend to the supporting portion 10S.

In some embodiments, the dielectric layer 40 may further include a protruding portion 40X inserting into the magnetic layer 22 between adjacent conductive wires 24 as shown in FIG. 1A. The protruding portion 40X is able to divide the electronic component 20 into two or more inductive regions, and the dimension including width, length and depth of the protruding portion 40X may be modified to adjust the inductance of the electronic component 20.

In some embodiments of the present disclosure, the electronic component 20 is at least partially embedded in the cavity 10C of the substrate 10, and thus the overall thickness of the package substrate 1 can be reduced. The slot recess 22R1 of the opaque magnetic layer 22 exposes the conductive wires 24, and makes the conductive wires 24 visible. Accordingly, the perforation 40P of the dielectric layer 40 can be accurately formed using the visible conductive wire 24 as an alignment mark. Therefore, the conductive trace 30 formed in the perforation 40P can be accurately aligned with the conductive wire 24. Compared to a circular profile, the non-circular second upper surface 242U of the second section 242 can enhance the adhesion between the conductive trace 30 and the conductive wire 24, and thus reliability of the connection between the conductive trace 30 and the conductive wire 24 can be increased.

Figure 2A:
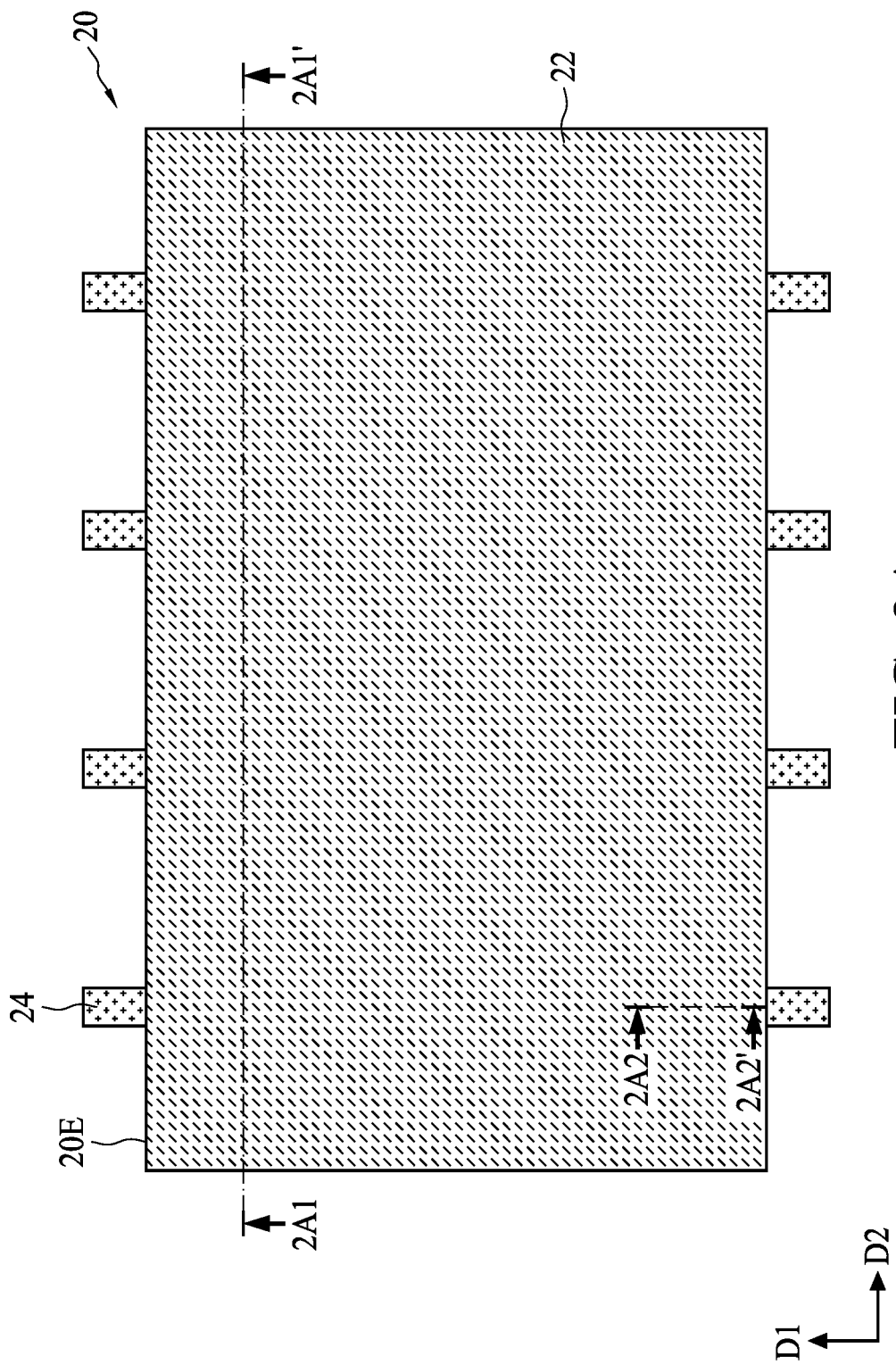
Figure 2B:
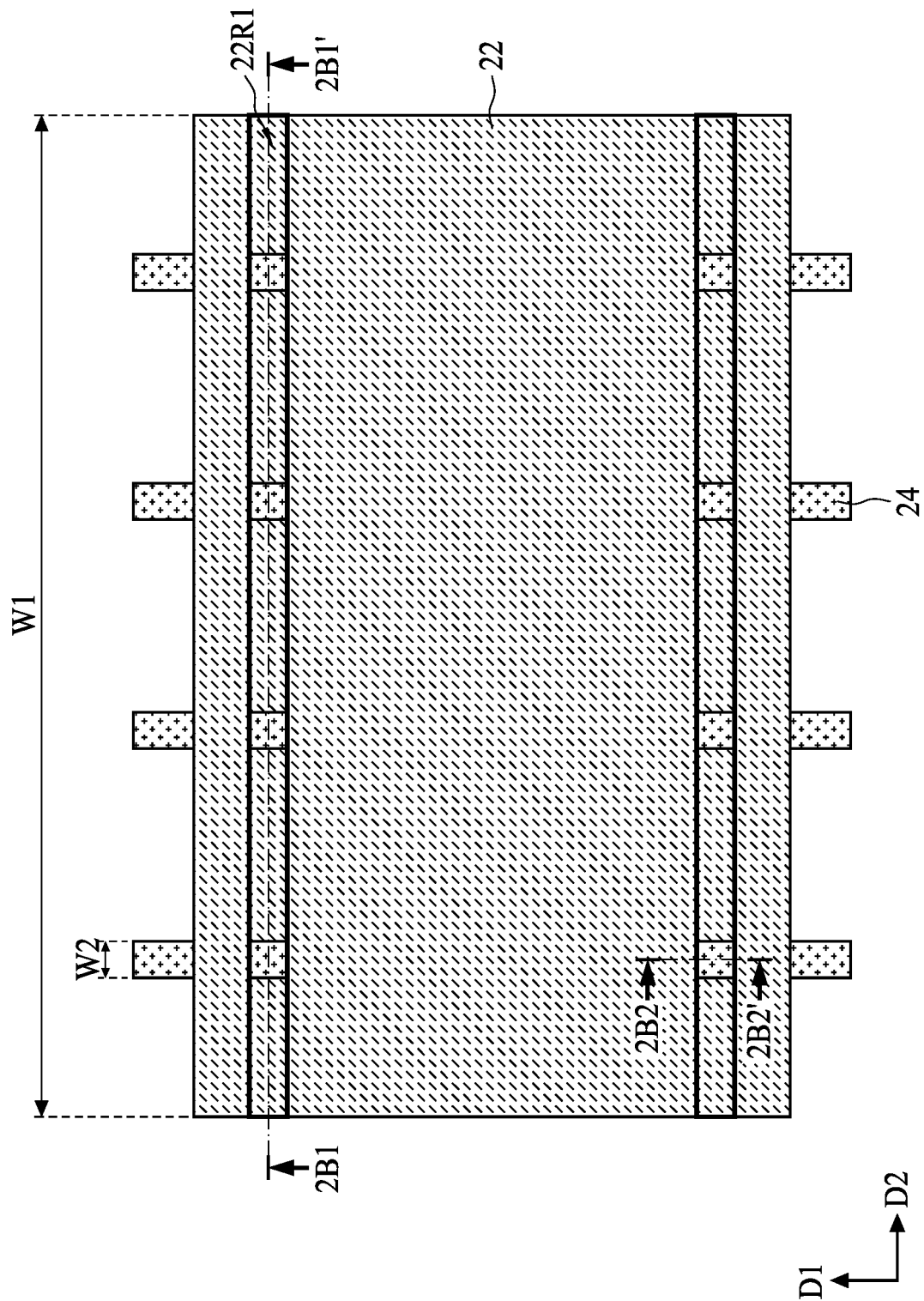

FIG. 2A, FIG. 2A1, FIG. 2A2, FIG. 2B, FIG. 2B1, FIG. 2B2, FIG. 2C, FIG. 2D and FIG. 2E illustrate operations of manufacturing a package substrate in accordance with some embodiments of the present disclosure, where FIG. 2A and FIG. 2B are drawn from top view, and FIG. 2A1, FIG. 2A2, FIG. 2B1, FIG. 2B2, FIG. 2C, FIG. 2D and FIG. 2E are drawn from cross-sectional view. FIG. 2A depicts a top view of an electronic component, FIG. 2A1 is a cross-sectional view along line 2A1-2A1' of FIG. 2A, and FIG. 2A2 is a cross-sectional view along line 2A2-2A2' of FIG. 2A. Referring to FIG. 2A, FIG. 2A1 and FIG. 2A2, an electronic component 20 is provided. The electronic component 20 includes a magnetic layer 22 and conductive wires 24 at least partially covered by the magnetic layer 22. In some embodiments, the conductive wires 24 are straight wires arranged in parallel and extended along a first direction D1. In some other embodiments, the conductive wires 24 may be bended wires, curved wires, winding wires or the like. In some embodiments, two ends of each conductive wire 24 may protrude out from respective edges 20E of the electronic component 20. Alternatively, two ends of each conductive wire 24 may be substantially coplanar with respective edges 20E of the electronic component 20.

FIG. 2B depicts a top view of the electronic component, FIG. 2B1 is a cross-sectional view along line 2B1-2B1' of FIG. 2B, and FIG. 2B2 is a cross-sectional view along line 2B2-2B2' of FIG. 2B. Referring to FIG. 2B, FIG. 2B1 and FIG. 2B2, the magnetic layer 22 and the conductive wires 24 are recessed to form one or more recesses 22R1 partially exposing a portion of the conductive wire 24. In some embodiments, the magnetic layer 22 and the conductive wires 24 are recessed along a second direction D2 intersecting the first direction D1 such that the recess 22R1 can expose a portion of each conductive wire 24 even though the conductive wires 24 covered by the magnetic layer 22 is invisible. In some embodiments, the second direction D is substantially perpendicular to the second direction D2. In some embodiments, the recess 22R1 is formed in a mechanical manner, for example, by a wheel cutter. The wheel cutter may remove the magnetic layer 22 as well as a portion of the conductive wires 24 along the second direction D2 such that the recess 22R1 can be a slot or a trench continuously transversing the conductive wires 24. As shown in FIG. 2B, a minimum width W1 of the recess 22R1 along the second direction D2 is wider than a width W2 of the conductive wire 24 in the second direction D2. The recess 22R1 may include a substantially vertical sidewall profile, or an inclined sidewall profile. After the magnetic layer 22 and the conductive wires 24 are recessed, each conductive wire 24 includes a first section 241 embedded in the magnetic layer 22, and a second section 242 connected to the first section 241 and thinner than the first section 241. The first upper surface 241U of the first section 241 is covered by the magnetic layer 22. The second upper surface 242U of the second section 242 is lower than the first upper surface 241U, and exposed from the recess 22R1. In some embodiments, the first upper surface 241U of the first section 241 includes a convex surface, and the second upper surface 242U of the second section 242 includes a substantially flat surface.

Figure 2C:
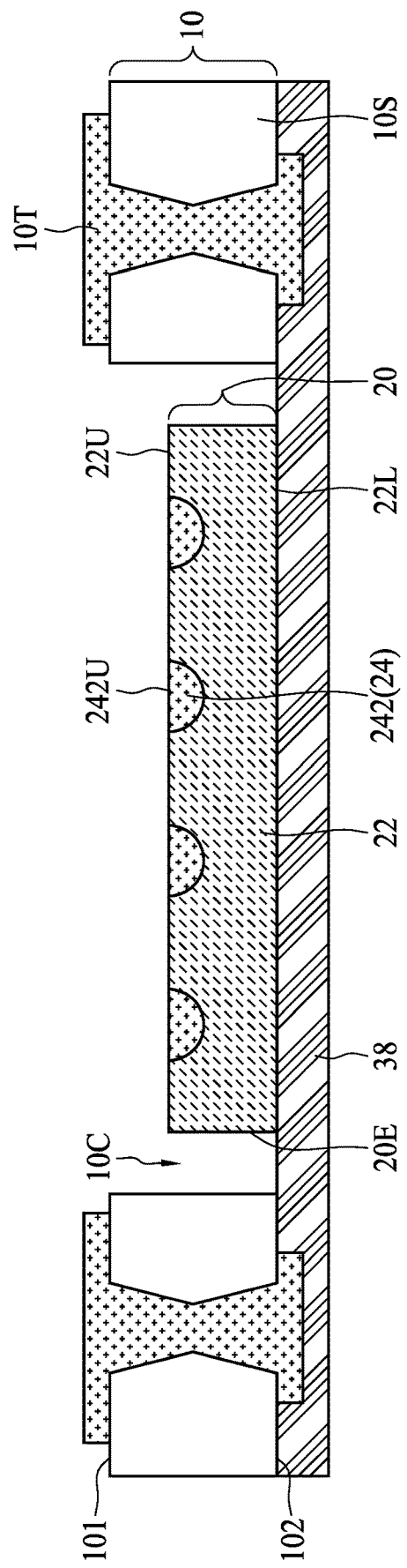

As shown in FIG. 2C, the electronic component 20 is disposed in a cavity 10C of a substrate 10. In some embodiments, a tape 38 is adhered to the second surface 102 of the substrate 10 to seal the cavity 10C, and the electronic component 20 is disposed in the cavity 10C and fixed with the tape 38. Since the second sections 242 of the conductive wires 24 are observable through the recesses 22R1, the electronic component 20 can be accurately aligned using the second sections 242 of the conductive wires 24 exposed through the recesses 22R1 as an align mark.

Figure 2D:
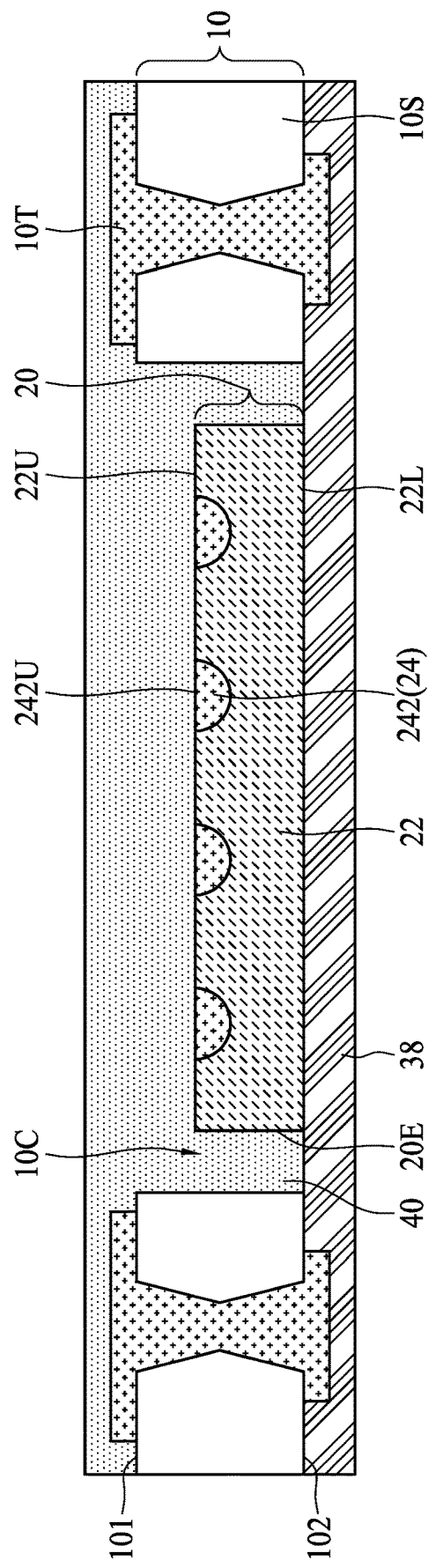

As shown in FIG. 2D, a dielectric layer 40 is formed in the cavity 10C and in the recess 22R1. In some embodiments, the dielectric layer 40 may be flowable, and the fluid of the dielectric layer 40 may be filled in the cavity 10C and between the edges 20E of the electronic component 20 and the supporting portion 10S of the substrate 10. The dielectric layer 40 may further cover the first surface 101 of the substrate 10. The dielectric layer 40 may be thermally and/or optically cured to be solidified.

Figure 2E:
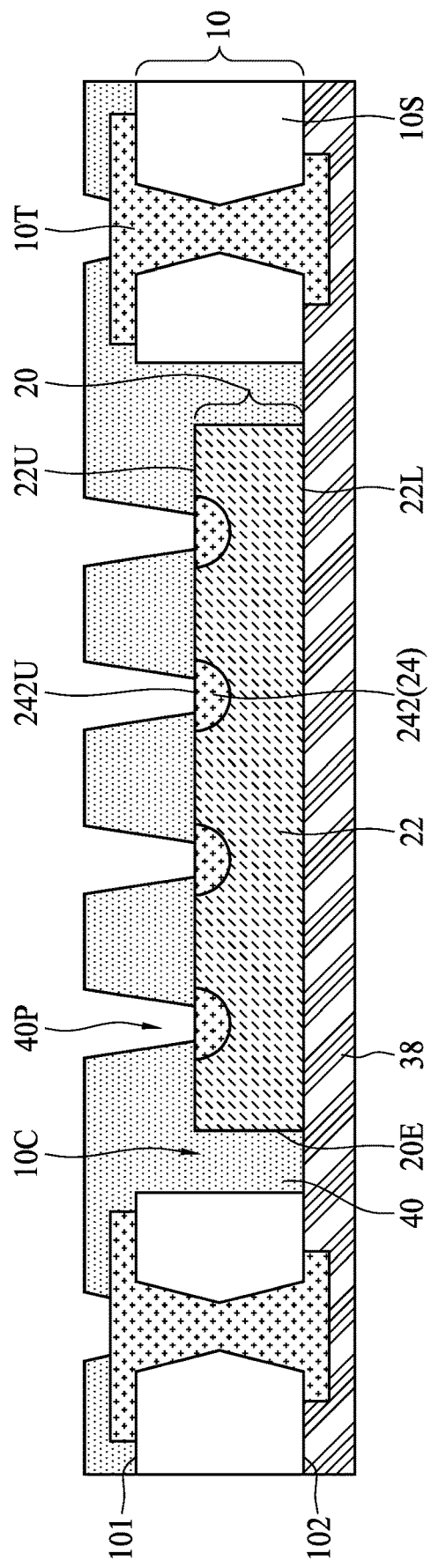

As shown in FIG. 2E, perforations 40P are formed in the dielectric layer 40 in the recesses 22R1 to expose the second sections 242 of the conductive wires 24. In some embodiments, the perforations 40P may be, but is not limited to be, formed in an optical manner, for example by laser drilling. The perforation 40P may include, but is not limited to, an inclined sidewall profile. Since the second sections 242 of the conductive wires 24 are observable through the recesses 22R1 and the transparent dielectric layer 40, the locations of the perforations 40P can be accurately aligned using the second sections 242 of the conductive wires 24 exposed through the recesses 22R1 as an align mark. In some embodiments, the tape 38 can be removed after the dielectric layer 40 is formed. Alternatively, the tape 38 may be reserved. Conductive traces 30 are formed on the second sections 242 of the conductive wires 24 exposed through the perforations 40P of the dielectric layer 40 to form the package substrate 1 as shown in FIG. 1, FIG. 1A, FIG. 1B and FIG. 1C.

The package substrates and manufacturing methods of the present disclosure are not limited to the above-described embodiments, and may be implemented according to other embodiments. To streamline the description and for the convenience of comparison between various embodiments of the present disclosure, similar components of the following embodiments are marked with same numerals, and may not be redundantly described.

Figure 3:
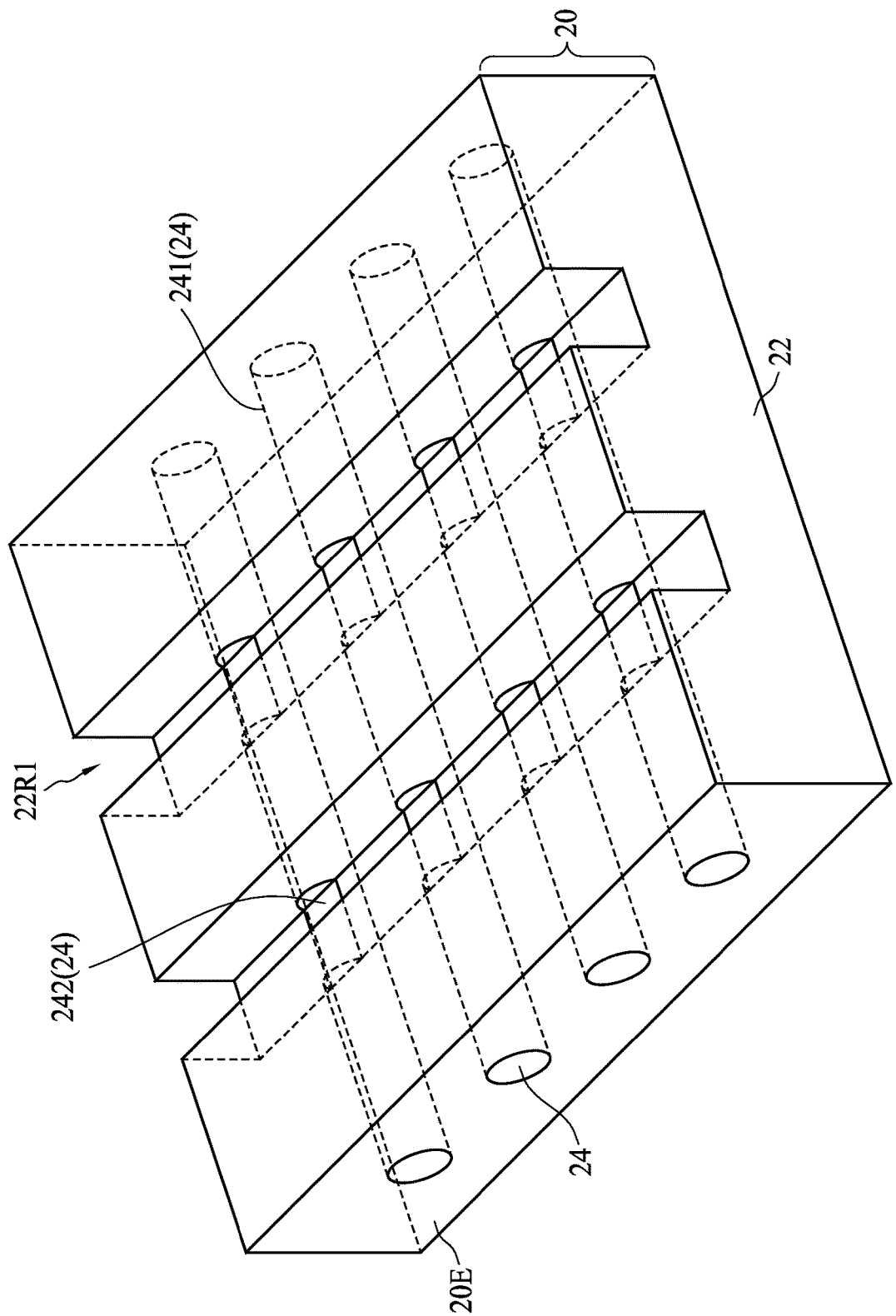
FIG. 3 is a schematic perspective view of an electronic component in accordance with some embodiments of the present disclosure.
Figure 3A:
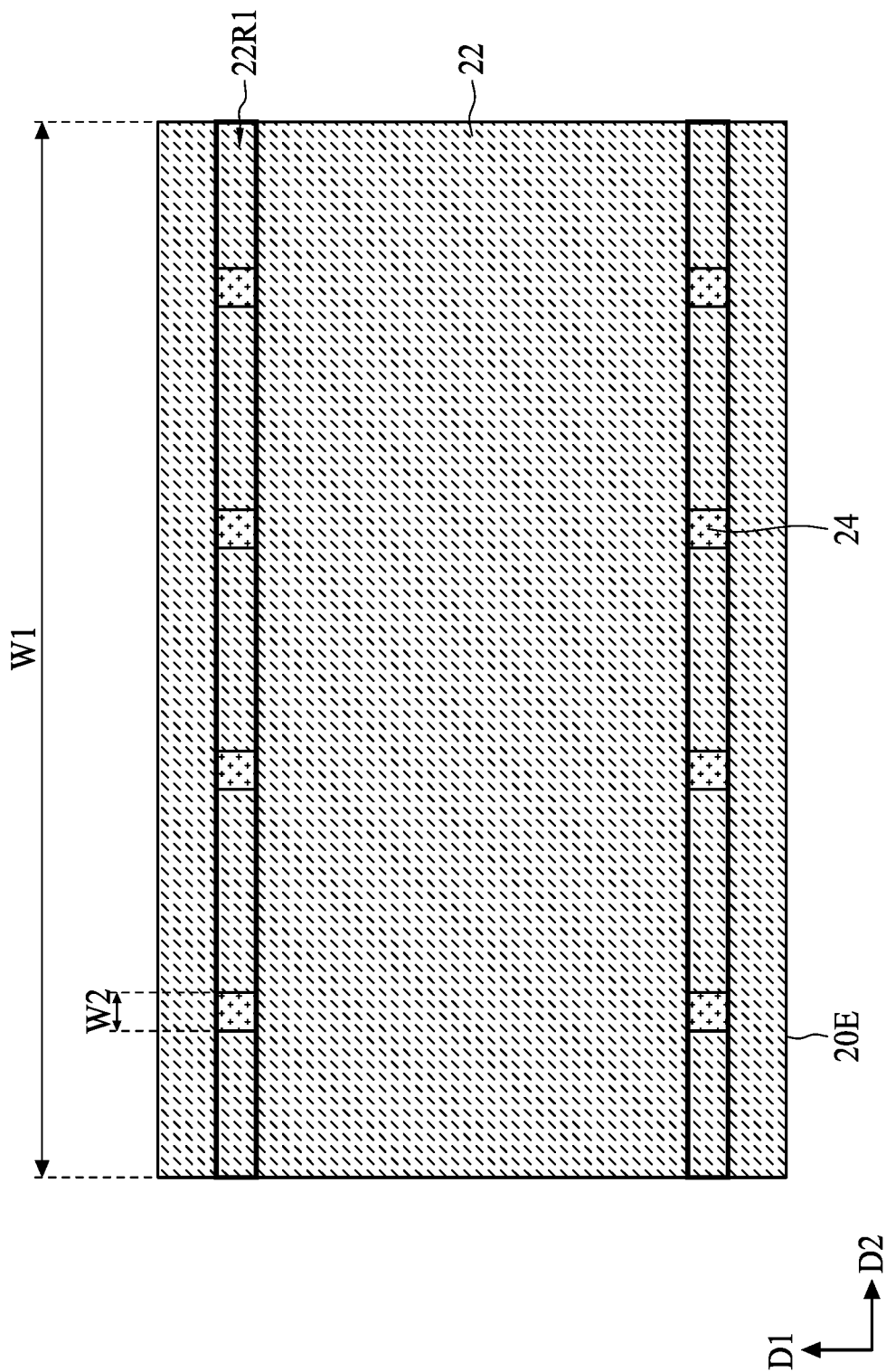
FIG. 3A is a schematic cross-sectional view of an electronic component in accordance with some embodiments of the present disclosure.

FIG. 3 is a schematic perspective view of an electronic component 20 in accordance with some embodiments of the present disclosure, and FIG. 3A is a schematic cross-sectional view of an electronic component 20 in accordance with some embodiments of the present disclosure. As shown in FIG. 3 and FIG. 3A, in contrast to the electronic component 20 illustrated in FIG. 2B, two ends of each conductive wire 24 is substantially coplanar with respective edges 20E of the electronic component 20.

Figure 4:
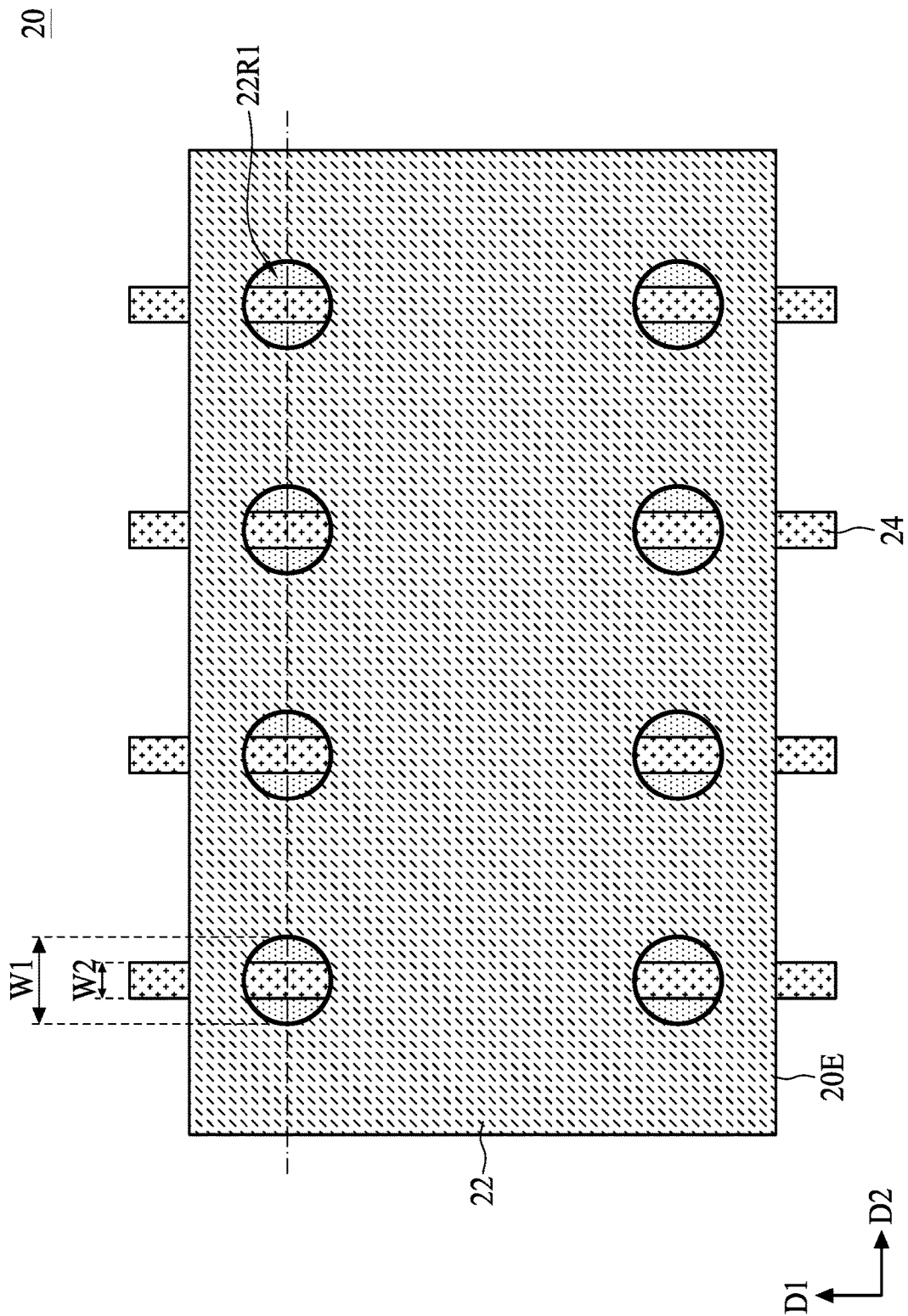
FIG. 4 is a schematic top view of an electronic component in accordance with some embodiments of the present disclosure.
Figure 4A:
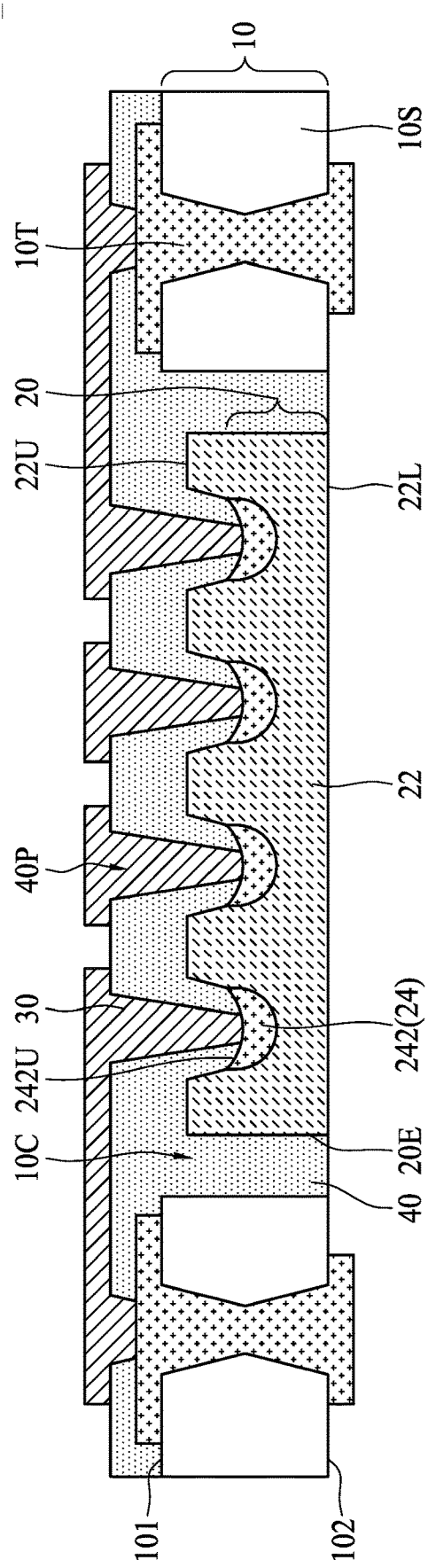
FIG. 4A is a schematic cross-sectional view of a package substrate in accordance with some embodiments of the present disclosure.
Figure 4B:
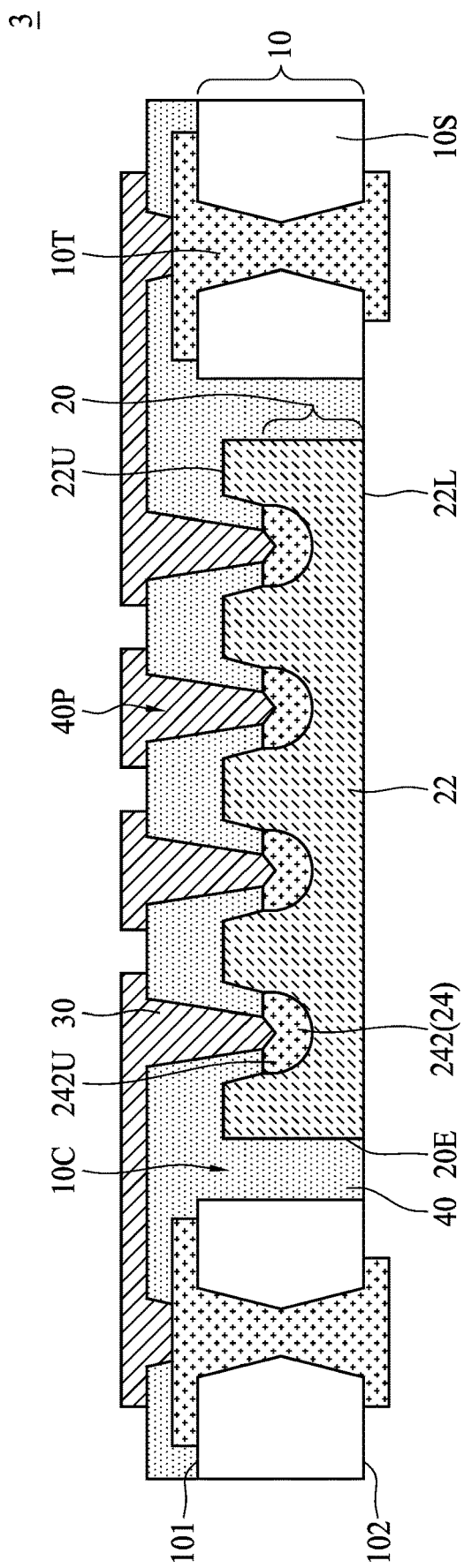
FIG. 4B is a schematic cross-sectional view of a package substrate in accordance with some embodiments of the present disclosure.

FIG. 4 is a schematic top view of an electronic component 20 in accordance with some embodiments of the present disclosure, FIG. 4A is a schematic cross-sectional view of a package substrate 2 in accordance with some embodiments of the present disclosure, and FIG. 4B is a schematic cross-sectional view of a package substrate 3 in accordance with some embodiments of the present disclosure. As shown in FIG. 4, the recesses 22R1 of the magnetic layer 22 may include a plurality of holes disconnected from one another, and exposing the second upper surfaces 242U of the second sections 242 of the conductive wires 24, respectively. The minimum width W1 of the recess 22R1 along the first direction D1 or the second direction D2 is wider than the width W2 of the conductive wire 24 in the second direction D2. The shape of the hole may include circular shape, rectangular shape or other shape. In some embodiments, the recess 22R1 is formed in a mechanical manner, for example, by a drill. In some embodiments, the second upper surface 242U of the second section 242 of the conductive wire 24 after the recess 22R1 is formed may include a concaved surface as shown in FIG. 4A. In some other embodiments, the second upper surface 242U of the second section 242 of the conductive wire 24 after the recess 22R1 is formed may include a notched surface as shown in FIG. 4B. The concaved surface or the notched surface of the second upper surface 242U of the second section 242 may be engaged with the conductive trace 30, and thus the adhesion can be enhanced.

Figure 5A:
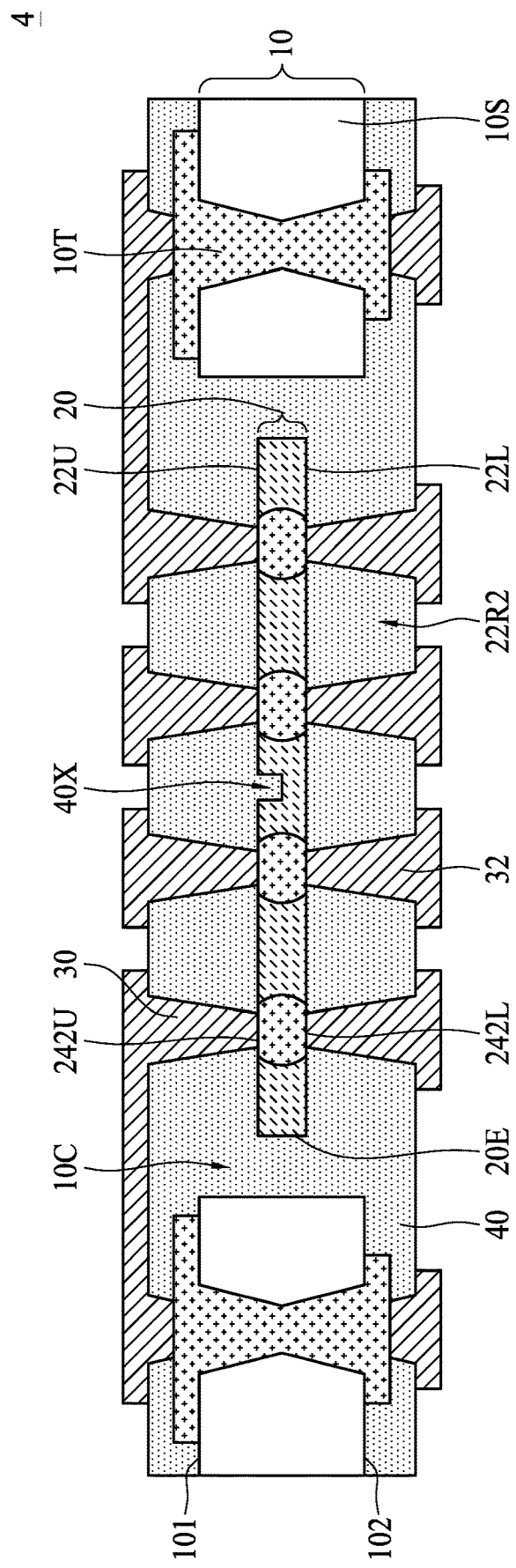
FIG. 5A and FIG. 5B are schematic cross-sectional views of a package substrate along different lines in accordance with some embodiments of the present disclosure.
Figure 5B:
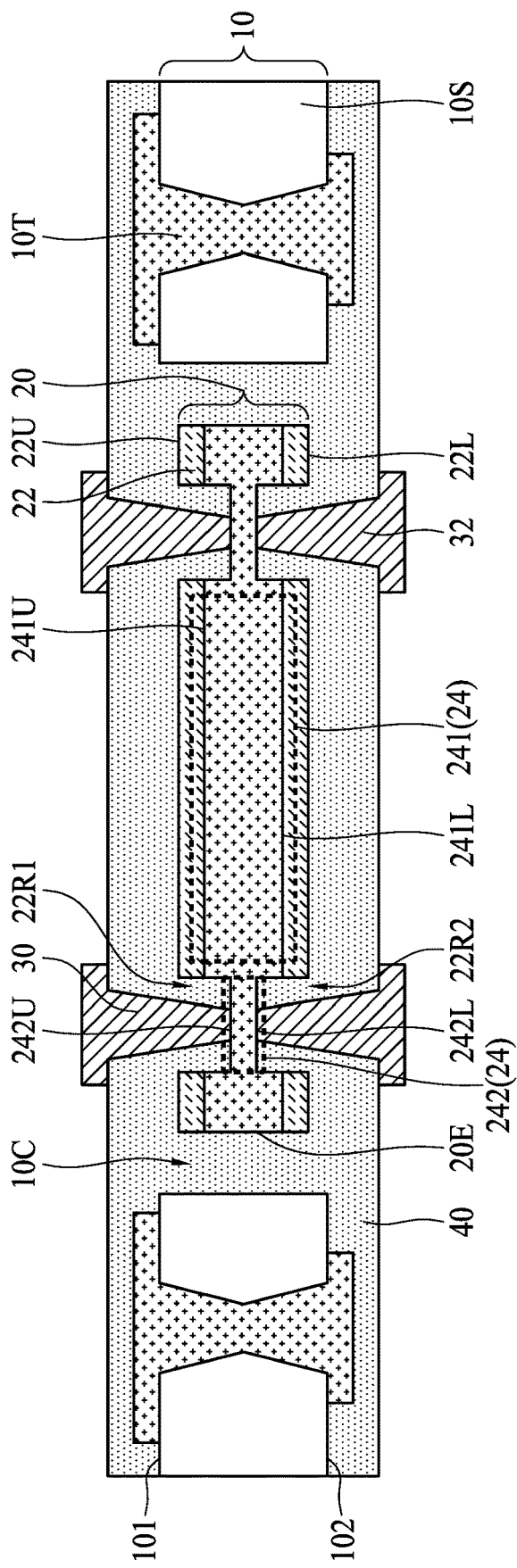

FIG. 5A and FIG. 5B are schematic cross-sectional views of a package substrate 4 in accordance with some embodiments of the present disclosure, where FIG. 5A is drawn along a line similar to the line 1A-1A' of FIG. 1, and FIG. 5B is drawn along a line similar to the line 1B-1B' of FIG. 1. As shown in FIG. 5A and FIG. 5B, in contrast to the package substrate 1 in FIG. 1, FIG. 1A, FIG. 1B and FIG. 1C, the magnetic layer 22 of the package substrate 4 further includes another recess (e.g., a second recess) 22R2 disposed in the lower surface 22L and partially exposing the conductive wire 24. The first lower surface 241L of the first section 241 of the conductive wire 24 may be covered by the magnetic layer 22, the second lower surface 242L of the second section 242 is higher than the first lower surface 241L of the first section 241, and the recess 22R2 exposes the second lower surface 242L of the second section 242. The package substrate 4 may further include another conductive trace (e.g., a second conductive trace) 32 in the recess 22R2 and electrically connected to the conductive wire 24. In some embodiments, the recesses 22R1 and 22R2 may be aligned with each other. In some embodiments, some of the conductive structures 10T may be electrically connected to the conductive traces 30 as shown in FIG. 5A. In some other embodiments, some of the conductive structures 10T may not be electrically connected to the conductive traces 30 as shown in FIG. 5B. In some other embodiments, some of the conductive structures 10T may be electrically connected to the conductive traces 32.

In some embodiments, the dielectric layer 40 may further include a protruding portion 40X inserting into the magnetic layer 22 between adjacent conductive wires 24. The protruding portion 40X may divide the electronic component 20 into two or more inductive regions, and the dimension including width, length and depth of the protruding portion 40X may be modified to adjust the inductance of the electronic component 20.

Figure 6:
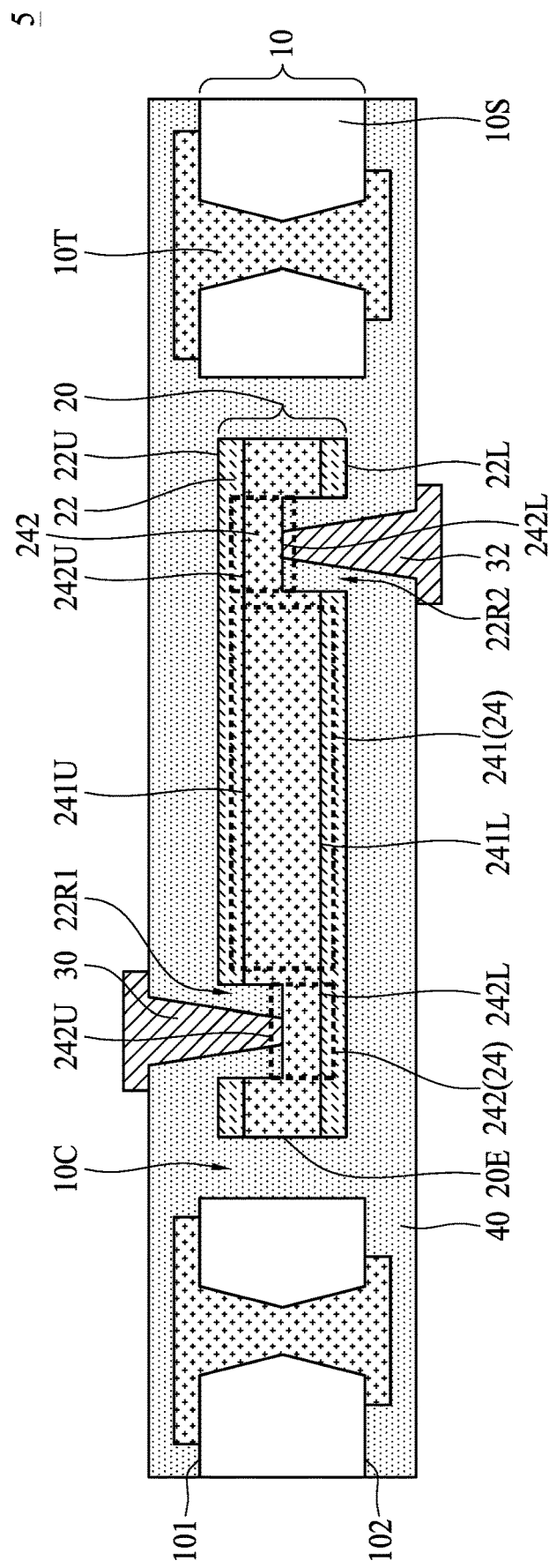
FIG. 6 is a schematic cross-sectional view of a package substrate in accordance with some embodiments of the present disclosure.

FIG. 6 is a schematic cross-sectional view of a package substrate 5 in accordance with some embodiments of the present disclosure. The package substrate 5 may be an alternative embodiment of the package substrate 4 of FIG. 5B. As shown in FIG. 6, the recesses 22R1 and 22R2 may be misaligned with each other. For example, the recess 22R1 may be substantially aligned with one end of the conductive wire 24, while the recess 22R2 may be substantially aligned with the other end of the conductive wire 24. The conductive structures 10T may be electrically connected to the conductive traces 30 or electrically disconnected from the conductive traces 30.

Figure 7:
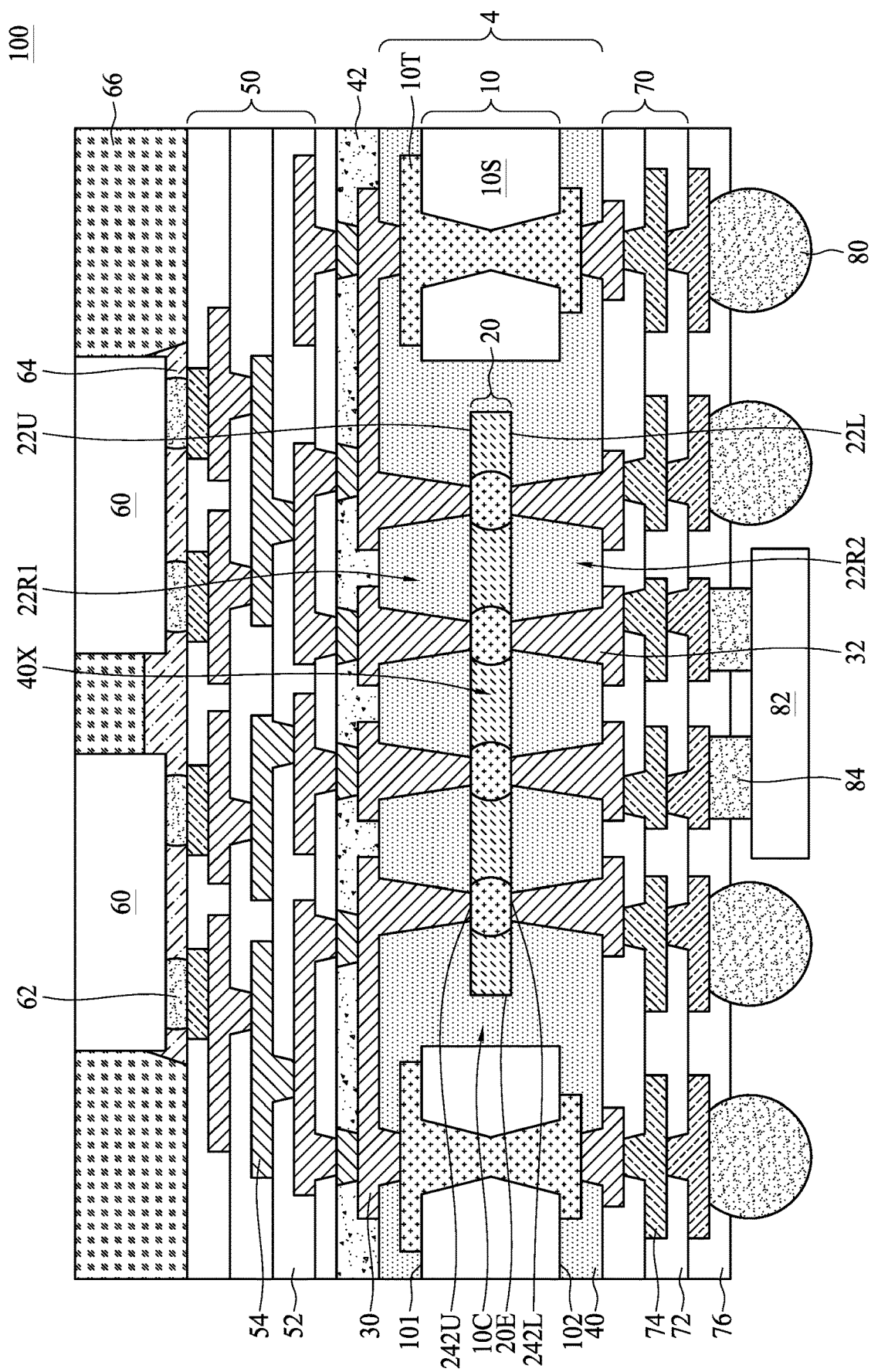
FIG. 7 illustrates operations of manufacturing an electronic device package in accordance with some embodiments of the present disclosure.

FIG. 7 illustrates operations of manufacturing an electronic device package 100 in accordance with some embodiments of the present disclosure. As shown in FIG. 7, a package substrate is provided. The package substrate 4 illustrate in FIG. 5A is selected as an example, but not limited to. Any other package substrate described above can be selected. A first redistribution layer (RDL) 50 may be formed on the first surface 101 of the substrate 10. The first RDL 50 may include one or more insulative layers 52 and one or more conductive layers 54 stacked on one another. In some embodiments, a buffer layer 42 may be formed on the first surface 101 of the substrate 10 prior to forming the first RDL 50. The buffer layer 42 may increase the adhesion between the first RDL 50 and the package substrate 4, and alleviate warpage issue. One or more first semiconductor dies 60 may be disposed on and electrically connected to the first RDL 50. In some embodiments, the first semiconductor dies 60 may be electrically connected to the first RDL 50 in a flip chip manner with conductive bumps 62 such as solder bumps or the like facing the first RDL 50, and an underfill 64 may be formed between the first semiconductor dies 60 and the first RDL 50. The first semiconductor dies 60 may include any types of active die, passive die or a combination thereof. The first semiconductor dies 60 may be electrically connected to the electronic component 20 and the conductive structures 10T through the first RDL 50. An encapsulation layer 66 may be formed to encapsulate the first semiconductor dies 60. The encapsulation layer 66 may include molding compound, and may partially or entirely encapsulate the first semiconductor dies 60.

In some embodiments, a plurality of electrical connectors 80 such as solder balls may be formed on the second surface 102. A second RDL 70 may be formed on the second surface 102 of the substrate 10 prior to forming the plurality of electrical connectors. The second RDL 70 may include one or more insulative layers 72 and one or more conductive layers 74 stacked on one another. In some embodiments, a passivation layer 76 such as a solder mask may be formed on the second RDL 70 to partially expose the bonding pads of the second RDL 70, and the electrical connectors 80 are connected to the exposed bonding pads. In some embodiments, a second semiconductor die 82 may be disposed on and electrically connected to the second RDL 70. In some embodiments, the second semiconductor die 80 may be electrically connected to the second RDL 70 in a flip chip manner with conductive bumps 84 such as solder bumps or the like. The second semiconductor die 82 may include any types of active die, passive die or a combination thereof. In some embodiments, the second semiconductor die 82 and the electrical connectors 80 are disposed at substantially a same horizontal level. The second semiconductor die 82 may be thinner than the electrical connectors 80, such that the electrical connectors 80 may be further connected to an external electronic component such as a printed circuit board (PCB).

In some embodiments of the present disclosure, the package substrate includes an electronic component embedded in the cavity of the substrate, and thus the overall thickness of the package substrate can be reduced. The recess of the opaque magnetic layer exposes the conductive wires, and makes the conductive wires visible. Accordingly, the perforation of the dielectric layer can be accurately formed using the visible conductive wire as an alignment mark. Therefore, the conductive trace formed in the perforation can be accurately aligned with the conductive wire. The non-circular upper surface of the conductive wire can enhance the adhesion between the conductive trace and the conductive wire, and thus reliability of the connection between the conductive trace and the conductive wire can be increased.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. An electronic component, comprising:
   a magnetic layer; and
   a conductive wire comprising a first section embedded in the magnetic layer, and a second section exposed from the magnetic layer,
   wherein the first section includes a side surface exposed from the second section.

2. The electronic component of claim 1, further comprising a second conductive wire having a third section embedded in the magnetic layer and a fourth section exposed from the magnetic layer.

3. The electronic component of claim 2, wherein the second section and the fourth section are aligned along a same direction.

4. The electronic component of claim 1, wherein the side surface of the first section is covered by a dielectric layer.

5. The electronic component of claim 1, wherein the magnetic layer includes a recess disposed in an upper surface of the magnetic layer thereof and exposing the second section of the conductive wire.

6. The electronic component of claim 5, wherein a dielectric layer fills the recess.

7. The electronic component of claim 5, wherein a bottom surface of the recess is defined by the second section of the conductive wire.

8. The electronic component of claim 5, wherein the bottom surface of the recess is collectively defined by the second section of the conductive wire and the magnetic layer.

9. The electronic component of claim 5, wherein the recess includes a recessed portion recessed inward from a top surface of the conductive wire.

10. An electronic component, comprising:
a magnetic layer; and
a conductive wire comprising a first section embedded in the magnetic layer, and a second section connected to the first section and thinner than the first section,
wherein a first upper surface of the first section is covered by the magnetic layer, a second upper surface of the second section is lower than the first upper surface.

11. The electronic component of claim 10, wherein the magnetic layer includes a first recess in an upper surface of the magnetic layer and exposing the second upper surface of the second section.

12. The electronic component of claim 10, wherein the second upper surface of the second section is a bottom portion recessed from the first upper surface of the first section.

13. The electronic component of claim 10, wherein the conductive wire further comprising a side surface extends from the second upper surface of the second section to the first upper surface of the first section, wherein the side surface is aligned with a side surface of the magnetic layer.

14. A package substrate, comprising:
a substrate including a first surface and a second surface opposite to the first surface;
an electronic component disposed in the substrate, the electronic component comprising:
a magnetic layer including an upper surface adjacent to the first surface and a lower surface adjacent to the second surface; and
a conductive wire comprising a first section embedded in the magnetic layer and a second section connected to the first section and exposed from the upper surface of the magnetic layer; and
a first conductive trace extending into the magnetic layer and electrically connected to the second section of the conductive wire; and
a dielectric layer disposed over the magnetic layer, wherein a top surface of the dielectric layer is aligned with a top surface of the magnetic layer.

15. The package substrate of claim 14, wherein the dielectric layer is disposed between the magnetic layer and the first conductive trace.

16. The package substrate of claim 15, wherein the dielectric layer encapsulates the first conductive trace.

17. The package substrate of claim 15, wherein the dielectric layer extends in the magnetic layer.

18. The package substrate of claim 15, wherein the dielectric layer is disposed between the magnetic layer and the substrate.

* * * * *